United States Patent
Recaman Payo et al.

(10) Patent No.: US 9,496,430 B2
(45) Date of Patent: Nov. 15, 2016

(54) METHOD FOR FORMING PATTERNS OF DIFFERENTLY DOPED REGIONS

(71) Applicant: IMEC, Leuven (BE)

(72) Inventors: Maria Recaman Payo, Leuven (BE); Niels Posthuma, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/172,697

(22) Filed: Feb. 4, 2014

(65) Prior Publication Data

US 2014/0179054 A1 Jun. 26, 2014

Related U.S. Application Data

(63) Continuation of application No. PCT/EP2012/065014, filed on Aug. 1, 2012.

(60) Provisional application No. 61/515,788, filed on Aug. 5, 2011.

(51) Int. Cl.
| | |
|---|---|
| *H01L 21/00* | (2006.01) |
| *H01L 31/0224* | (2006.01) |
| *H01L 21/02* | (2006.01) |
| *H01L 31/068* | (2012.01) |
| *H01L 31/18* | (2006.01) |
| *H01L 21/225* | (2006.01) |

(52) U.S. Cl.
CPC . *H01L 31/022458* (2013.01); *H01L 21/02532* (2013.01); *H01L 21/02576* (2013.01); *H01L 21/02579* (2013.01); *H01L 21/02642* (2013.01); *H01L 31/0682* (2013.01); *H01L 31/1804* (2013.01); *H01L 21/2255* (2013.01); *H01L 21/2257* (2013.01); *Y02E 10/547* (2013.01); *Y02P 70/521* (2015.11)

(58) Field of Classification Search
CPC ............... H01L 31/022458; H01L 21/02579; H01L 31/1804; H01L 21/02642; H01L 21/02576; H01L 31/0682; H01L 21/02532; H01L 21/2257; H01L 21/2255; H01L 31/035236–31/035263; Y02P 70/521; Y02E 10/547
See application file for complete search history.

(56) References Cited

U.S. PATENT DOCUMENTS

| | | | | |
|---|---|---|---|---|
| 4,974,045 | A | * 11/1990 | Okita | ............................ 257/518 |
| 2010/0051085 | A1 | * 3/2010 | Weidman et al. | ............ 136/244 |
| 2010/0139764 | A1 | 6/2010 | Smith | |
| 2012/0208338 | A1 | * 8/2012 | Booth et al. | .................. 438/302 |

FOREIGN PATENT DOCUMENTS

| | | |
|---|---|---|
| WO | WO 2010/025262 A2 | 3/2010 |
| WO | WO 2011/017339 A2 | 2/2011 |
| WO | WO 2013/020868 A1 | 2/2013 |

OTHER PUBLICATIONS

International Search Report and Written Opinion for International Application No. PCT/EP2012/065014, mailed on Nov. 2, 2012 in 11 pages.

\* cited by examiner

*Primary Examiner* — William F Kraig
*Assistant Examiner* — Stanetta Isaac
(74) *Attorney, Agent, or Firm* — Knobbe, Martens, Olson & Bear LLP

(57) ABSTRACT

The disclosed technology generally relates to forming patterns of doped semiconductor regions, and more particularly to methods of forming such patterns in fabricating photovoltaic devices. In one aspect, a method of forming a pattern of different doped regions at the same side of a semiconductor substrate comprises providing a patterned doped layer on a surface of the semiconductor substrate at predetermined locations where at least one first doped region is to be formed. The method additionally includes selectively growing at least one second doped region epitaxially at the same side of the semiconductor substrate using the patterned doped layer as an epitaxial growth mask. Furthermore, selectively growing comprises driving dopants from the patterned doped layer into the semiconductor substrate to form the first doped region at the predetermined locations.

15 Claims, 3 Drawing Sheets

METHOD FOR FORMING PATTERNS OF DIFFERENTLY DOPED REGIONS

CROSS REFERENCE TO RELATED APPLICATIONS

This application is a continuation of PCT Application No. PCT/EP2012/065014, filed Aug. 1, 2012, which claims priority under 35 U.S.C. §119(e) to U.S. provisional patent application 61/515,788 filed on Aug. 5, 2011. Each of the above applications is incorporated herein by reference in its entirety.

BACKGROUND OF THE INVENTION

1. Field of the Invention

The disclosed technology generally relates to methods of forming patterns of differently doped regions at a surface of a semiconductor substrate, and more particularly relates to such methods that can be used in fabrication processes for photovoltaic cells.

2. Description of the Related Technology

In methods for fabricating advanced photovoltaic cells, there can be a need for providing patterns comprising differently doped regions such as, for example, a local back surface field (BSF), a selective emitter, or emitter regions and BSF regions. Such differently doped regions can be formed in, for example, an interdigitated back contact (IBC) cell. Formation of such doped regions can leads to increased complexity of and increased cost of photovoltaic cell fabrication processes.

Patterned doped regions can, for example, be formed in a semiconductor substrate by a dopant diffusion process, e.g., after having provided a mask (e.g., a deposition mask, or a growth mask). Formation of the patterned doped regions by a diffusion process can lead to one of several undesirable results. For example, diffusion processes can lead to the presence of a doped glass that needs to be removed after diffusion. Furthermore, diffusion processes can lead to a high surface dopant concentration, which may be disadvantageous when the diffusion process is used e.g. for forming an emitter, because the high surface dopant concentration can give rise to a high surface recombination velocity resulting in a low open-circuit voltage. In addition, diffusion processes can give rise to poor blue response, resulting in poor short-circuit current density. Furthermore, diffusion processes can lead to a doping profile with a thickness (depth) below about 1 micrometer, which may be disadvantageous when the diffusion process is used e.g., for forming an emitter and is combined with a silicide-based contact metallization. In order to reduce the high surface dopant concentration and/or increase the depth of the doping profile after such diffusion processes, additional drive-in steps may be performed, which can lead to an increase the overall number of process steps and thus lead to an overall increase in the complexity of the solar-cell fabrication processing.

Alternatively, patterned doped regions can, for example, be formed by ion implantation. The main drawback of this approach is the crystal damage introduced by the implantation process. This damage can be removed by performing a high-temperature annealing process that is also used to activate the implanted dopants.

SUMMARY OF CERTAIN INVENTIVE ASPECTS

In one aspect, a method is disclosed for forming patterns of differently doped regions comprising at least one first doped region and at least one second doped region at a same side of a semiconductor substrate, where the at least one first doped region has a different doping type (n or p type) and/or a different doping profile as compared to the at least one second doped region. The method offers a large versatility in doping profiles, wherein the need for performing an annealing process, such as e.g. for dopant activation, for dopant drive-in and/or for damage removal, is avoided, wherein the need for removing a doped glass layer is avoided, and wherein the number of process steps and thus the process complexity is reduced as compared to prior-art methods.

The disclosed technology relates to a method for forming patterns of differently doped regions at a surface of a semiconductor substrate. More in particular, the disclosed technology relates to a method for forming at least one first patterned doped region and at least one second patterned doped region at a same side of a semiconductor substrate, the at least one first doped region having a different doping type and/or a different doping profile as compared to the at least one second doped region.

In embodiments of the disclosed technology, the at least one first doped region is formed by diffusion of dopants from a patterned doped layer, e.g. a patterned doped dielectric layer, deposited on a surface of the semiconductor substrate. The at least one second doped region is formed by selectively growing a doped epitaxial layer (SEG, selective epitaxial growth) on the surface of the semiconductor substrate, using the patterned doped layer as a deposition or a growth mask. The diffusion of dopants from the patterned doped layer, e.g. patterned doped dielectric layer, occurs during the epitaxial growth, such that the need for performing an annealing process for dopant drive-in and/or for dopant activation is avoided.

It is an advantage of using epitaxial growth for forming doped regions that it allows a large variety in thicknesses (e.g. nm to µm range) and doping concentrations (e.g. about $10^{16}$ to $10^{20}$ at/cm$^3$).

The disclosed technology relates to methods for forming patterns of differently doped regions comprising at least one first doped region and at least one second doped region at a same side of a semiconductor substrate. Such a method comprises: providing a patterned doped layer on a surface of the semiconductor substrate at locations where the at least one first doped region is to be formed; and selectively growing a doped epitaxial layer at the same side of the semiconductor substrate using the patterned doped layer as a deposition or growth mask, thereby forming the at least one second doped region. This method results in the growth of a doped epitaxial layer (the at least one second doped region) at locations where the semiconductor substrate is exposed, i.e. at locations where it is not covered by the patterned doped layer. During this selective epitaxial growth, dopants from the patterned doped layer diffuse into the semiconductor substrate, thereby forming the at least one first doped region. The doped epitaxial layer forms the at least one second doped region.

It is an advantage of a method according to embodiments of the disclosed technology that it allows simplified patterning of doped regions. This is for example particularly advantageous in a fabrication process for IBC cells, where an interdigitated pattern of emitter regions and BSF regions needs to be formed at the rear side of a substrate. In such a process the patterned doped layer, e.g. patterned doped dielectric layer, can serve as a dopant source and as a mask for selective epitaxial growth. Furthermore, a doped layer, e.g. doped dielectric layer, having the same doping type as the substrate can also be provided at the front side of the substrate before selective epitaxial growth. Dopants from this doped dielectric layer then diffuse into the substrate during epitaxial growth, resulting in the formation of a front surface field (FSF). As a result the process complexity of an interdigitated back contact (IBC) cell fabrication process can be reduced substantially as compared to prior art processes.

In certain embodiments, the semiconductor substrate is a silicon substrate. However, the disclosed technology is not limited thereto and other semiconductor substrates can be used, such as for example germanium (Ge) substrates. The semiconductor substrate used can be monocrystalline, multicrystalline or polycrystalline.

In one embodiment, the method is used for the creation of interdigitated emitter regions and BSF regions at the rear side of interdigitated back contact photovoltaic cells. However, the disclosed technology is not limited thereto and the method of the disclosed technology can be used for creating other doping patterns and/or it can be used in a fabrication process for other devices.

For example, a method according to the foregoing embodiments can also be used for forming a selective emitter comprising heavily doped emitter regions having a high surface dopant concentration to enable a low contact resistance with metal contacts and lightly doped emitter regions having a lower surface dopant concentration to enable a good blue response of the photovoltaic cells and low surface recombination.

The patterned doped layer can for example be a patterned doped dielectric layer such as a phosphosilicate glass (PSG) layer or a borosilicate glass (BSG) layer. Such a doped dielectric layer can be formed by heating the substrate to a temperature above 700° C. in an environment comprising a dopant source, such as for example a solid dopant source (e.g. BN, $As_2O_3$, $P_2O_5$), a liquid dopant source (e.g. $BBr_3$, $BCl_3$, $AsCl_3$, $POCl_3$) or a gaseous dopant source (e.g. $B_2H_6$, $AsH_3$, $PH_3$). In such embodiments the dopants may already to some extent diffuse into the substrate during the step of providing the doped layer, but not to an extent that would be sufficient for a good performance of the device. Alternatively, the doped dielectric layer can be provided at lower temperatures, e.g. in the range between 300° C. and 500° C., for example by means of chemical vapour deposition (CVD) methods or by any other suitable method known to a person skilled in the art. However, the disclosed technology is not limited thereto and other suitable doped layers (such as for example an amorphous silicon layer) or layer stacks allowing selective epitaxial growth can be used.

Patterning of the doped layer can for example be done by means of photolithography followed by dry or wet etching, by screen printing of a polymer mask followed by dry or wet etching, by laser ablation or by any other suitable method known by a person skilled in the art. In embodiments of the disclosed technology, instead of first providing a plain doped layer followed by patterning, the doped layer can be directly patterned, e.g. by printing such as for example screen printing or inkjet printing.

Growing the doped epitaxial layer can for example be done at a temperature ranges between about 600° C. and 1200° C., between about 800° C. and 1200° C., between about 650° C. and 950° C., or between about 850° C. and 950° C.

In one aspect, the method can advantageously be used in fabrication processes for photovoltaic cells. For example, in a fabrication process for IBC cells the method can be used for forming interdigitated emitter regions and BSF back surface field (BSF) regions at the rear side of the cells. For example, the emitter regions can be formed by growing a doped epitaxial layer having a doping type opposite to the doping type of the substrate, and the BSF regions can be formed by diffusion of dopants from a patterned doped dielectric layer (having the same doping type as the substrate) during epitaxial deposition. Or vice versa, the BSF regions can be formed by growing a doped epitaxial layer having the same doping type as the substrate and the emitter regions can be formed by diffusion of dopants (during epitaxial deposition) from a patterned doped dielectric layer having a doping type opposite to the doping type of the substrate. It is an advantage of a method according to embodiments of the disclosed technology that it results in a simplified IBC fabrication process with a reduced number of process steps as compared to prior-art methods.

A method according to embodiments of the disclosed technology can for example also be used for forming a selective emitter structure comprising differently doped regions, e.g. regions having a same doping type but a different doping profile. For example, highly doped regions can be formed by growing a doped epitaxial layer having a doping type opposite to the doping type of the substrate, and lowly doped regions can be formed by diffusion of dopants from a patterned doped dielectric layer (also having a doping type opposite to the doping type of the substrate) during epitaxial deposition. Or vice versa, lowly doped regions can be formed by growing a doped epitaxial layer having a doping type opposite to the doping type of the substrate, and highly doped regions can be formed by diffusion of dopants from a patterned doped dielectric layer (also having a doping type opposite to the doping type of the substrate) during epitaxial deposition.

It is an advantage of a method according to embodiments of the disclosed technology that the number of process steps needed for forming patterns of differently doped regions is reduced. For example, there is no need for performing a dedicated dopant drive-in process or a dopant activation process, and there is no need for removing the doped dielectric layers.

A method according to embodiments of the disclosed technology allows a large versatility in doping concentrations and doping profiles (e.g. junction depths, surface dopant concentrations).

The invention, both as to organization and method of operation, together with features and advantages thereof, may best be understood by reference to the following detailed description of an embodiment, when read in conjunction with the accompanying drawings.

Figure 1:
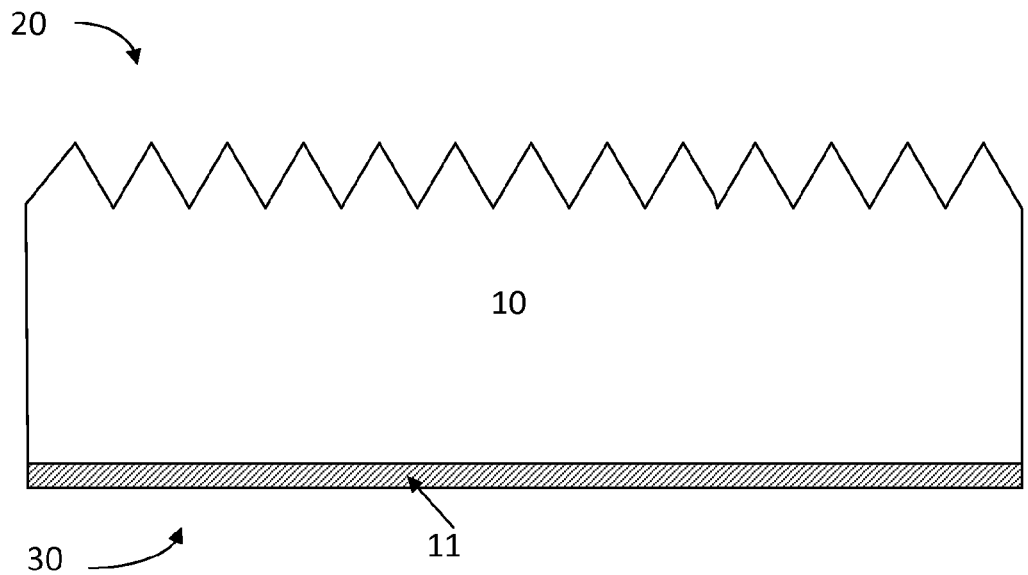
FIGS. 1-5 illustrate intermediate structures of a photovoltaic cell at various stages of fabrication.

In the different drawings, the same reference signs refer to the same or analogous elements.

DETAILED DESCRIPTION OF CERTAIN ILLUSTRATIVE EMBODIMENTS

In the following detailed description, numerous specific details are set forth in order to provide a thorough understanding of the invention and how it may be practiced in particular embodiments. However, it will be understood that the present invention may be practiced without these specific details. In other instances, well-known methods, procedures and techniques have not been described in detail, so as not to obscure the present invention. While the present invention will be described with respect to particular embodiments and with reference to certain drawings, the invention is not limited hereto. The drawings included and described herein are schematic and are not limiting the scope of the invention. It is also noted that in the drawings, the size of some elements may be exaggerated and, therefore, not drawn to scale for illustrative purposes.

Furthermore, the terms first, second, third and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the invention described herein may be capable of operation in other sequences than described or illustrated herein.

Moreover, the terms top, bottom, over, under and the like in the description are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising" should not be interpreted as always being restricted to the features listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

In the context of the present disclosure, the front surface or front side of a photovoltaic cell or of a substrate refers to the surface or side adapted for being oriented towards a light source and thus for receiving illumination. The back surface, rear surface, back side or rear side of a photovoltaic cell or of a substrate refers to the surface or side opposite to the front surface or side.

Referring to FIG. 1, a silicon substrate 10, e.g., an n-type silicon substrate 10, having for example, a doping concentration in the range between about $10^{15}$ at/cm$^3$ and $6\times10^{16}$ at/cm$^3$, is provided, according to an embodiment. In some implementations, the front side 20 of the substrate 10 is textured. However, in some other implementations, texturing of the front side 20 can also be done at a later stage of the process. At the rear side 30 of the substrate 10 a doped dielectric layer 11 having the same (conductivity) doping type as the substrate 10 is formed. The doped dielectric layer 11 can, for example, have a doping concentration in the range between about $10^{19}$ at/cm$^3$ and $10^{22}$ at/cm$^3$. The thickness of the doped dielectric layer 11 can, for example, be in the range between about 5 nm and 500 nm, e.g. between 50 nm and 300 nm. However, the disclosed technology is not limited thereto and other suitable doping concentrations and other suitable layer thicknesses can be used.

Figure 2:
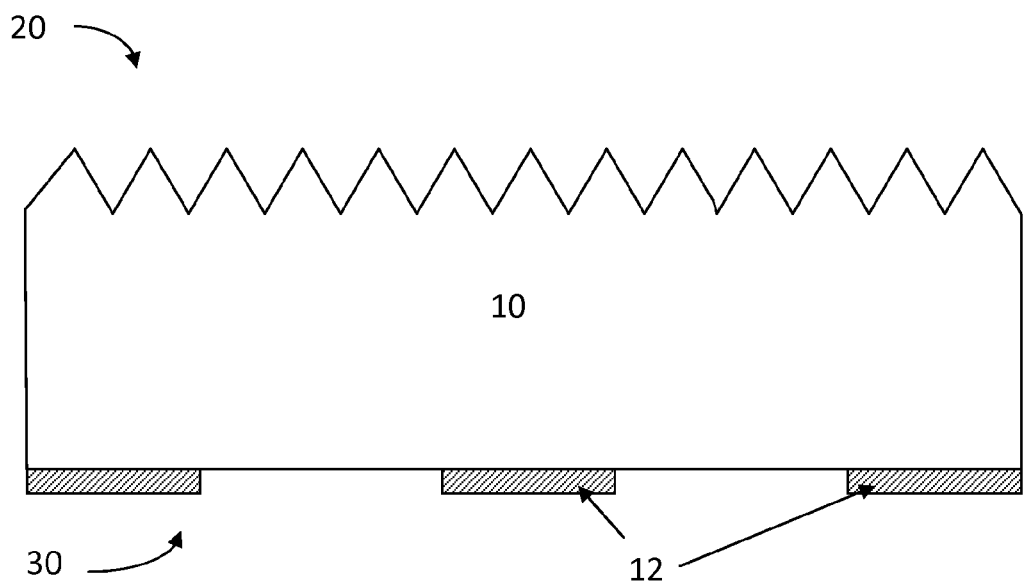

Referring to FIG. 2, after forming the doped dielectric layer 11, the doped dielectric layer 11 is patterned, according to an embodiment. Patterning can be performed, for example, by using a laser ablation process or by using lithographic patterning combined with dry or wet etching, thereby forming a patterned doped dielectric layer 12. In the illustrated embodiment, the doped dielectric layer is patterned so that the doped dielectric remains at locations corresponding to where back surface field (BSF) regions can be formed at later processes.

In some embodiments, the process of providing the doped dielectric layer 11 can lead to some diffusion of dopants from the doped dielectric layer 11 into the underlying substrate 10, resulting in a shallow doped region over the entire semiconductor surface, for example, in embodiments where the doped dielectric layer is formed at temperatures above 700° C. In these embodiments, while not illustrated in FIG. 2 for clarity, after patterning the doped dielectric layer to form the patterned doped dielectric layer 12, a surface portion of the substrate 10 comprising the shallow doped region can be etched selectively at locations not covered by the patterned dielectric layer 12, thereby locally removing the shallow doped region. Selective etching of the substrate can be done by dry etching (e.g., by plasma etching) or by wet etching (e.g., by HF:HNO$_3$:CH$_3$COOH, TMAH or KOH etching), using the patterned doped dielectric layer 12 as an etching mask.

Figure 3:
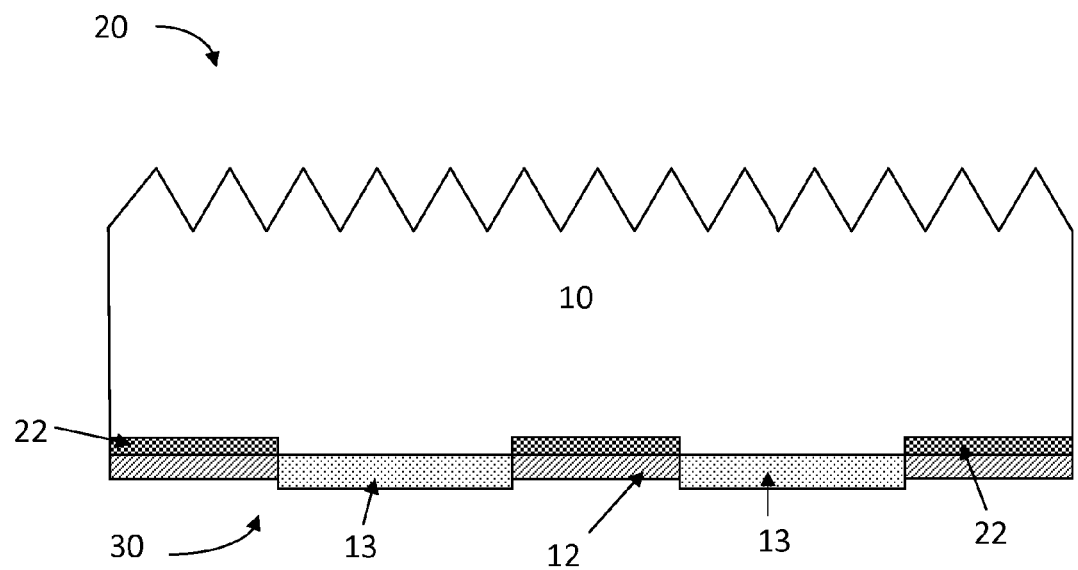

Referring to FIG. 3, after patterning to form the doped dielectric layer 12, a doped silicon layer 13 is selectively formed over exposed regions of the substrate 10 by, for example, a selective epitaxial growth process, according to an embodiment. In the illustrated embodiment, the doped silicon layer 13 has a doping type opposite to the doping type of the substrate 10. The selective epitaxial growth can be performed, for example, using the patterned doped dielectric layer 12 as an epitaxial growth mask for epitaxial growth. That is, the growth of the of the doped silicon layer 13 would selectively occur on surfaces of the substrate 10 that are exposed by the patterning of the doped dielectric layer 12. The selective epitaxial growth can, for example, be performed at temperature ranges between about 600° C. and 1200° C., between about 650° C. and 950° C., or between about 850° C. and 950° C. In addition, the thickness of the doped silicon layer 13 can, for example, be in the range between about 500 nm and 5 micrometers, or between about 1 micrometer and 5 micrometers. In addition, the doping concentration can, for example, be in the range between about $10^{18}$ at/cm$^3$ and $5\times10^{19}$ at/cm$^3$, or between about $10^{19}$ at/cm$^3$ and $5\times10^{19}$ at/cm$^3$. However, the disclosed technology is not limited thereto, and other growth methods, temperatures, doping concentrations and/or layer thicknesses can be used.

In the illustrated embodiment in FIG. 3, the patterned doped silicon layer 13 forms the emitter regions of the photovoltaic cell. Advantageously, the temperature of the substrate during the epitaxial deposition of the doped silicon layer 13 can provide thermal energy for dopant atoms in the doped dielectric layer 12 to diffuse through the interface between the doped dielectric layer 12 and the underlying substrate 10, such that a back surface field regions 22 is formed without performing a separate doping and/or dopant drive-in process to form the back-surface field (BSF) regions 22.

Figure 4:
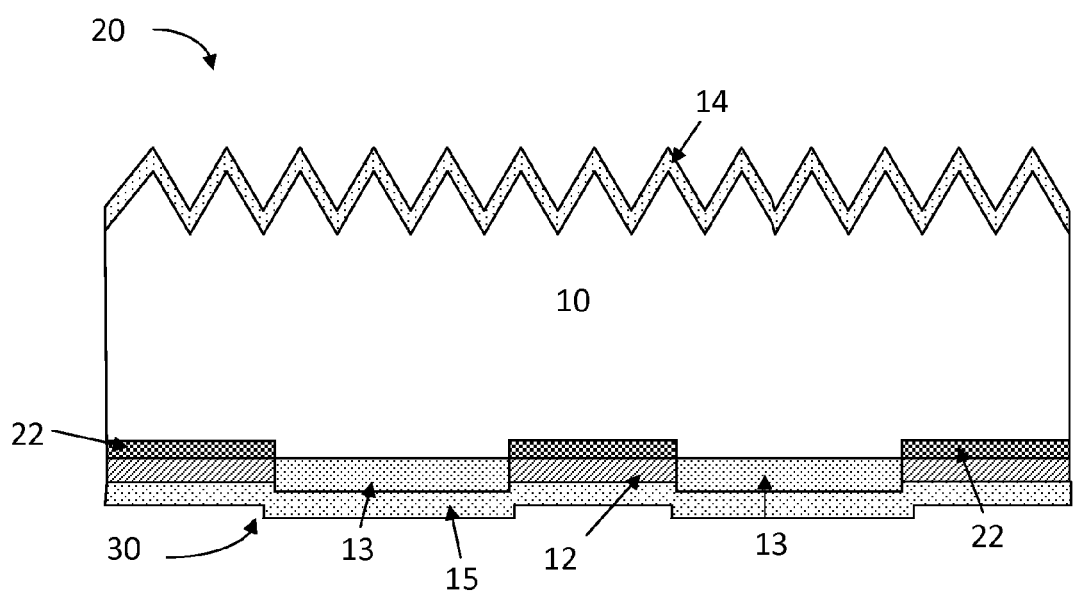

Referring to FIG. 4, after forming the back surface field regions 22, a surface passivation layers (not illustrated for clarity) can be provided at the front side 20 and at the rear side 30, according to an embodiment. The surface passivation layers can be formed, for example, by performing a thermal oxidation process or by chemical vapor deposition (CVD) and/or atomic layer deposition (ALD) of a dielectric layer or a dielectric layer stack (e.g. comprising SiO$_x$, SiN$_x$ and/or AlO$_x$) or by any other suitable method known to a person skilled in the art.

Referring to FIG. 4, after passivating the front side 20, an antireflection coating 14 on the passivation layer on the front side 20 can be provided and an additional protection layer 15 can be provided at the rear side, according to an embodiment. Although in the illustrated embodiment, the protection layer 15 is provided over the entire rear side, in other embodiments, the protection layer 15 can be provided locally, to cover, for example, at least the emitter regions 13. Protection layer 15 provides protection against metal penetration in a later part of the overall process. It may for example be a dielectric layer or a stack of dielectric layers, for example having a thickness in the range between 80 nm and 300 nm. However, the disclosed technology is not limited thereto, and other dielectric layer thicknesses can be used. The protection layer 15 can simultaneously provide good surface passivation and can also serve as a reflection layer (together with a metal layer on top of the protection layer 15) to improve light trapping in the photovoltaic cell.

Figure 5:
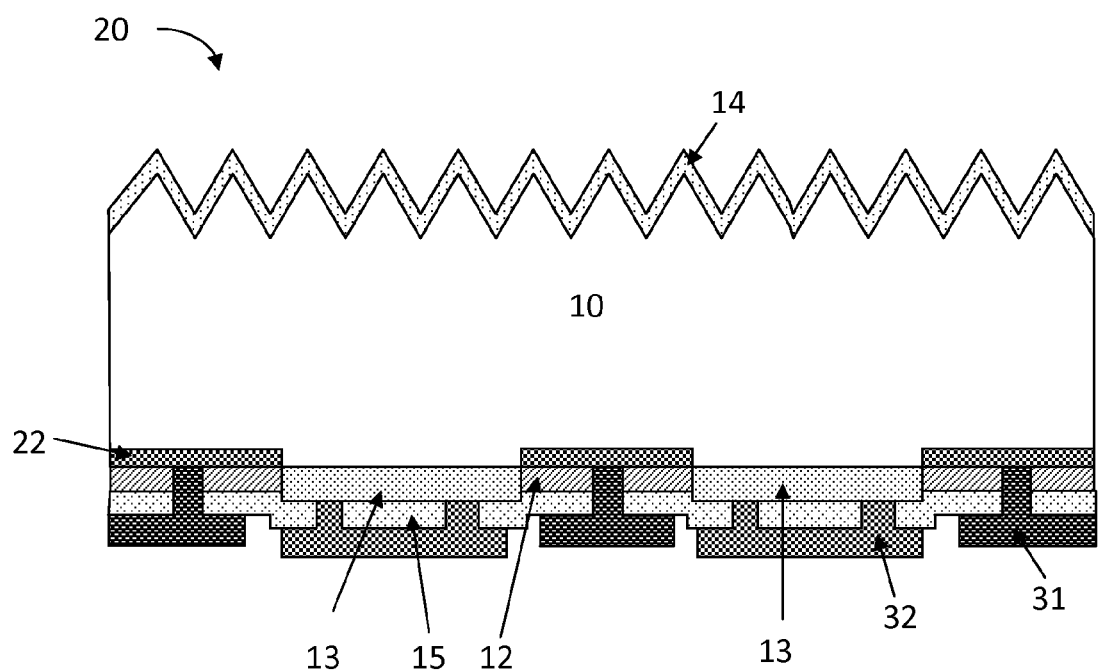

Referring to FIG. 5, after providing protection layer 15 at the rear side of the cell, first metal contacts 31 to the BSF regions 22 and second metal contacts 32 to the emitter regions 13 are provided, according to an embodiment.

In the embodiments described above with respect to FIGS. 1-5, the emitter regions 13 are formed by selective epitaxial growth and the BSF regions 22 are formed by diffusion of dopants from a patterned doped dielectric layer 12. However, other embodiments are also possible. For example, the emitter regions can be formed by diffusion of dopants from a patterned doped dielectric layer and BSF regions can be formed by selective epitaxial growth. In such embodiments the patterned doped dielectric layer 12 may also function as an emitter surface passivation layer in the final device.

In one embodiment, before performing the selective epitaxial growth process, a doped dielectric layer having the same doping type as the substrate can be also provided at the front side of the substrate. During epitaxial growth, dopants from the heavily doped dielectric layer diffuse into the substrate, thereby forming a front surface field region. However, alternative methods can be used for forming a front surface field region. For example, the front surface field region can also be formed by epitaxial growth.

The inventors have obtained experimental results in which a PSG layer was deposited by exposing a p-type silicon substrate (resistivity between 0.5 and 3 Ohm·cm) to an environment comprising $POCl_3$ at a temperature in the range between 780° C. and 850° C. Three different process conditions were used, involving different gas flows, different temperatures and/or different process durations, leading to three different sheet resistances of the P-doped regions. The following sheet resistances where obtained: (a) 104 Ohm per square for a deposition process performed for 10 minutes at 850° C.: (b) 54 Ohm per square for a deposition process performed for 10 minutes at 850° C. followed by a dopant drive-in process for 16 minutes at the same temperature in a nitrogen environment and (c) 130 Ohm per square for a deposition process performed for 35 minutes at 780° C. followed by a dopant drive-in process for 25 minutes at 805° C. After patterning of the PSG layer, a 1-micrometer thick B-doped silicon layer was provided by selective epitaxial growth at 950° C. for 5 minutes. After selective epitaxial growth the sheet resistances of the P doped regions were (a) 24 Ohm per square; (b) 21 Ohm per square; and (c) 48 Ohm per square respectively, indicating further diffusion or drive-in of dopants (phosphorus) from the PSG layer into the silicon substrate during selective epitaxial growth. In another experiment, after patterning of the PSG layer of sample (c) and selective epitaxial growth of a B-doped silicon layer at 850° C. for 19 minutes, the sheet resistance decreased from 130 Ohm per square to 104 ohm per square.

These results show that the sheet resistance of the doped region formed by diffusion of a dopant from the doped oxide layer can be tuned within a broad range during the selective epitaxial growth, by properly selecting the temperature and the duration of the selective epitaxial growth process. When combining diffusion from a doped layer with epitaxial growth to form an interdigitated BSF/emitter pattern at the rear side of an IBC cell, the duration of the diffusion process can be shortened and/or the thermal budget can be reduced compared to prior-art methods because during selective epitaxial growth the dopant drive-in from the doped layer may take place to an extent that leads to a suitable sheet resistance. In addition, during selective epitaxial growth a second doped layer with the required doping concentration and thickness, to work as emitter or BSF of an IBC cell, is formed without additional patterning processes and, therefore, process complexity is reduced as compared to prior art methods.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A method of forming a pattern of differently doped regions including at least one first doped region and at least one second doped region at the same side of a semiconductor substrate, the method comprising:
    providing patterned doped layer on a surface of the semiconductor substrate at predetermined locations where the at least one first doped region is to be formed; and
    selectively growing the at least one second doped region epitaxially at the same side of the semiconductor substrate using the patterned doped layer as an epitaxial growth mask,
    wherein selectively growing comprises driving dopants from the patterned doped layer into the semiconductor substrate to form the first doped region at the predetermined locations, and
    wherein the first doped region and the second doped region are doped with dopants of opposite types.

2. The method of claim 1, wherein the patterned doped layer comprises a doped dielectric layer.

3. The method of claim 1, wherein the first doped region and the second doped region have different doping profiles.

4. The method of claim 1, wherein providing the patterned doped layer includes providing an unpatterned doped layer and patterning the unpatterned doped layer by laser ablation.

5. A method of claim 1, further comprising patterning at least one additional patterned doped layer in addition to the patterned doped layer.

6. A method of forming a pattern of differently doped regions including at least one first doped region and at least one second doped region at the same side of a semiconductor substrate, the method comprising:

provide a patterned doped layer on a surface of the semiconductor substrate at redetermined locations where the at least one first doped region is to be formed; and selectively growing the at least one second doped region epitaxially at the same side of the semiconductor substrate using the patterned doped layer as an epitaxial growth mask, wherein selectively growing comprises driving dopants from the patterned doped layer into the semiconductor substrate to form the first doped region at the predetermined locations, and wherein the method is used for fabricating interdigitated back-contact photovoltaic cells, wherein the first doped region and the second doped region form an interdigitated pattern at the rear side of the semiconductor substrate.

7. The method of claim 6, wherein the first doped region comprises a back surface field (BSF) region, and wherein the second doped region comprises an emitter region.

8. The method of claim 6, wherein the first doped region comprises an emitter region, and wherein the second doped region comprises a back surface field (BSF) region.

9. The method of claim 6, further comprising providing a doped layer on the front surface of the semiconductor substrate before selectively growing the second doped region, wherein the doped layer has the same doping type as the substrate.

10. A method of forming doped semiconductor regions, comprising:

providing a semiconductor substrate;

forming a doped deposition mask comprising a first dopant on the semiconductor substrate, the doped deposition mask comprising a patterned insulator material covering portions of a substrate surface; and depositing a doped semiconductor material comprising a second dopant on exposed portions of the substrate surface, wherein the doped semiconductor material is deposited at a deposition temperature sufficiently high such that the first dopant diffuses from the doped deposition mask into the semiconductor substrate covered by the doped deposition mask, and wherein the first dopant is an opposite dopant type to the second dopant.

11. The method of claim 10, wherein the patterned insulator material is formed of a dielectric material comprising an element that serves as one of an n-type dopant or a p-type dopant for the semiconductor substrate.

12. The method of claim 10, wherein depositing the doped semiconductor material comprises epitaxially growing silicon selectively on exposed portions of the substrate surface.

13. The method of claim 12, wherein depositing comprises epitaxially growing silicon at a temperature in the range between about 600° C. and 1200° C.

14. The method of claim 10, wherein the deposition mask has a doping concentration in the range between about $10^{19}/cm^3$ and $10^{22}/cm^3$.

15. The method of claim 10, wherein forming the doped deposition mask comprises laser-ablating an unpatterned insulator material doped with the first dopant.

* * * * *

UNITED STATES PATENT AND TRADEMARK OFFICE
CERTIFICATE OF CORRECTION

PATENT NO. : 9,496,430 B2  
APPLICATION NO. : 14/172697  
DATED : November 15, 2016  
INVENTOR(S) : Maria Recaman Payo Page 1 of 1

It is certified that error appears in the above-identified patent and that said Letters Patent is hereby corrected as shown below:

In the Specification

In Column 6 at Line 27, Change "of the of the" to --of the--.

In the Claims

In Column 8 at Line 42, In Claim 1, after "providing" insert --a--.

In Column 9 at Line 4, In Claim 6, change "redetermined" to --predetermined--.

Signed and Sealed this  
Sixth Day of June, 2017

Michelle K. Lee  
*Director of the United States Patent and Trademark Office*